United States Patent [19]

Razeghi

[11] Patent Number: 5,410,178

[45] Date of Patent: Apr. 25, 1995

[54] SEMICONDUCTOR FILMS

[75] Inventor: Manijeh Razeghi, Evanston, Ill.

[73] Assignee: Northwestern University, Evanston, Ill.

[21] Appl. No.: 293,903

[22] Filed: Aug. 22, 1994

[51] Int. Cl.$^6$ .......................................... H01L 29/161
[52] U.S. Cl. ..................................... 257/615; 257/613
[58] Field of Search ............... 257/615, 613, 743, 744, 257/745

[56] References Cited

U.S. PATENT DOCUMENTS

| | | | |
|---|---|---|---|
| 3,364,084 | 1/1968 | Reuhrwein | 148/175 |
| 3,663,320 | 5/1972 | Maruyama et al. | 148/175 |
| 3,849,874 | 11/1974 | Jeffers | 29/590 |
| 4,207,122 | 6/1980 | Goodman | 148/33.4 |
| 4,368,098 | 1/1983 | Manasevit | 156/606 |
| 4,404,265 | 9/1983 | Manasevit | 428/689 |
| 4,720,309 | 1/1988 | Deveaud et al. | 148/33.1 |
| 4,793,872 | 12/1988 | Meunier et al. | 148/33.4 |
| 4,874,438 | 10/1989 | Oshita et al. | 148/400 |
| 4,902,356 | 2/1990 | Noguchi et al. | 148/33.4 |
| 4,908,686 | 3/1990 | Maserjian | 257/451 |
| 4,952,811 | 8/1990 | Elliot | 257/103 |
| 5,232,869 | 8/1993 | Frigo et al. | 437/133 |

OTHER PUBLICATIONS

P-Tl (Phosphorus-Thallium), R. C. Sharma and Y. A. Chang, *Binary Alloy Phase Diagrams*.
Chapter 5: Low-Pressure Metallo-Organic Chemical Vapor Deposition of Ga$_x$In$_{1-x}$As$_y$P$_{1-y}$Alloys, Manijeh Razeghi, *Semiconductors and Semimetals*, vol. 22, Part A pp. 300–378.
Chapter 4 GaInAsP-InP Systems: MOCVD Growth, Characterization and Application, pp. 164–215.
*Dictionary of Physics*, Longmans, Greens and Co. Ltd., p. 292.
Vapor Phase Epitaxial Growth and Characterization of Ga$_{1-y}$In$_1$As$_{1-x}$P$_x$, K. Sugiyama, H. Kojima, G. Enda and M. Shibata, *Japanese Journal of Applied Physics*, vol. 16, No. 12, Dec. 1977, pp. 2197–2203.
Thallium incorporation in molecular–beam–epitaxial InSb, C. E. C. Wood, A. Noreika and M. Francombe, *American Institute of Physics*, May 15, 1986, pp. 3610–3612.
Chapter 1 Growth Technolgy, C. Hilsum, Aug. 1988.
High photoconductive gain in lateral InAsSb strained-layer superlattice infrared detectors, S. R. Kurtz, R. M. Biefeld, L. R. Dawson, I. J. Fritz and T. E. Zipperian, *American Institute of Physics*, 14 Nov. 1988, pp. 1961–1963.
The MOCVD Challenge vol. 1: A Survey of GaInAsP-InP for Photonic and Electronic Applications, M. Razeghi, *IOP Publishing Ltd*, 1989, pp. 3–28.
Organometallic vapor phase epitaxial growth and characterization of InAsBi and InAsBi and InAsSbBi, K. Y. Ma, Z. M. Fang, D. H. Jaw, R. M. Cohen and G. B. Stringfellow, *American Institute of Physics*, 4 Dec. 1989, pp. 2420–2422.
Growth of InSb and GaAs by metalorganic chemical vapor deposition, R. M. Biefeld, and G. A. Hebner, *Elsevier Science Publishers B.V. (North Holland)*, 1991, pp. 272–278.
Ga$_{0.51}$In$_{0.49}$P/Ga$_x$In$_{1-x}$As lattice-matched (x=1) and strained (x=0.85) two-dimensional electron gas field--effect transistors, M. Razeghi, F. Omnes, Ph Maurel, Y. J. Chan and D. Pavlidis, *IOP Publishing Ltd*, 1991, pp. 103–107.
High-mobility InSb grown by organometallic vapor phase epitaxy, D. K. Gaskill, G. T. Stauf and N. Bottka, *American Institute of Physics*, 29 Apr. 1991, pp. 1905–1907.

(List continued on next page.)

*Primary Examiner*—Jerome Jackson
*Assistant Examiner*—Jhihan Clark
*Attorney, Agent, or Firm*—Welsh & Katz, Ltd.

[57] ABSTRACT

Semiconductor films of the formula (InP)$_{1-x}$(TlP$_3$)$_x$ on InP substrates which cover the bandgap of 2–12 µm for use with long wavelength infrared detector and laser applications are disclosed.

3 Claims, 1 Drawing Sheet

OTHER PUBLICATIONS

High-Power 0.8 μm InGaAsP-GaAs SCH SQW Lasers, D. Z. Garbuzov, N. Yu Antonishkis, A. D. Bondarev, A. B. Gulakov, S. N. Zhigulin, N. I. Katsavets, A. V. Kochergin and E. V. Rafailov (Invited Paper) *IEEE*, 1991, pp. 1531–1535.

Gas source molecular-beam epitaxial growth of normal incidence GaAs/AlGaAs quantum well infrared photodectors, J. M. Kuo, S. S. Pei, S. Hui, S. D. Gunapala and B. F. Levine, *American Vacuum Society*, Mar./Apr. 1992, pp. 769–770.

Accurate determination of misfit strain, layer thickness, and critical layer thickness in ultrathin buried strained InGaAs/GaAs layer b x-ray diffraction, Y. C. Chen, P. K. Bhattacharya and J. Singh, *American Vacuum Society*, Mar./Apr. 1992, pp. 769–770.

Photoexcited escape probability, optical gain, and noise in quantum well infrared photodetectors, B. F. Levine, A. Zussman, S. D. Gunapala, M. T. Asom, J. M. Kuo and W. S. Hobson, *American Institute of Physics*, 1 Nov. 1992 pp. 4429–4443.

Hawley's Condensed Chemical Dictionary (Twelfth Edition), *Van Nostrand Reinhold*, 1993, p. 38.

InTlSb: An infrared detector material? M. van Schilfgaarde and A. Sher, *American Institute of Physics*, 19 Apr. 1993, pp. 1857–1859.

Growth of $In_{1-x}Tl_xSb$, a new infrared material, by low-pressure metalorganic chemical vapor deposition, Y. H. Choi, C. Besikci, R. Sudharsanan and M. Razeghi, *American Institute of Physics*, 19 Jun. 1993, pp. 361–363.

The Electrochemical Society, Inc., 184th Meeting Program, Oct. 10–15, 1993.

Applied Physics Letters, Photoconductance measurements on InTlSb/InSb/GaAs grown by low-pressure metalorganic chemical vapor deposition, P. T. Staveteig, Y. H. Choi, G. Labeyrie, E. Bigan and M. Razeghi, *American Institute of Physics*, 24 Jan. 1994, vol. 64, No. 4, pp. 460–462.

InGaP/InGaAsP/GaAs 0.808 μm Separate Confinement Laser Diodes Grown by Metalorganic Chemical Vapor Deposition, J. Diaz, I. Eliashevich, K. Mobarhan, E. Kolev, L. J. Wang, D. Z. Garbuzov and M. Razeghi, *IEEE*, 1994, pp. 132–134.

Journal of Applied Physics, Y. H. Choi, P. T. Staveteig, E. Bigan and M. Razeghi, *American Institute of Physics*, vol. 75, No. 6, 15 Mar. 1994, pp. 3196–3198.

High-power laser diodes based on InGaAsP alloys, M. Razeghi, *Nature*, vol. 369, 23 Jun. 1994, pp. 631–633.

Electron Transport Properties of $Ga_{0.51}In_{0.49}P$ for Device Applications, C. Besikci and M. Razeghi, *IEEE*, 1994, pp. 1066–1069.

Efficiency of photoluminescence and excess carrier confinement in InGaAsP/GaAs structures prepared by metalorganic chemical-vapor deposition, J. Diaz, J. Yi, M. Erdtmann, X. He, E. Kolev, D. Garbuzov, E. Bigan and M. Raseghi, *American Institute of Physics*, 15 Jul. 1994, pp. 700–704.

Interface roughness scattering in thin, undoped GaInP/GaAs quantum wells, W. C. Mitchel, G. J. Brown and Ikai Lo, *American Institute of Physics*, 19 Sep. 1994, pp. 1578–1580.

On the Description of the Collision Terms in Three-Valley Hydrodynamic Models for GaAs Device Modeling, C. Besikci and M. Razeghi, *IEEE*, vol. 41, No. 8, Aug. 1994, pp. 1471–1475.

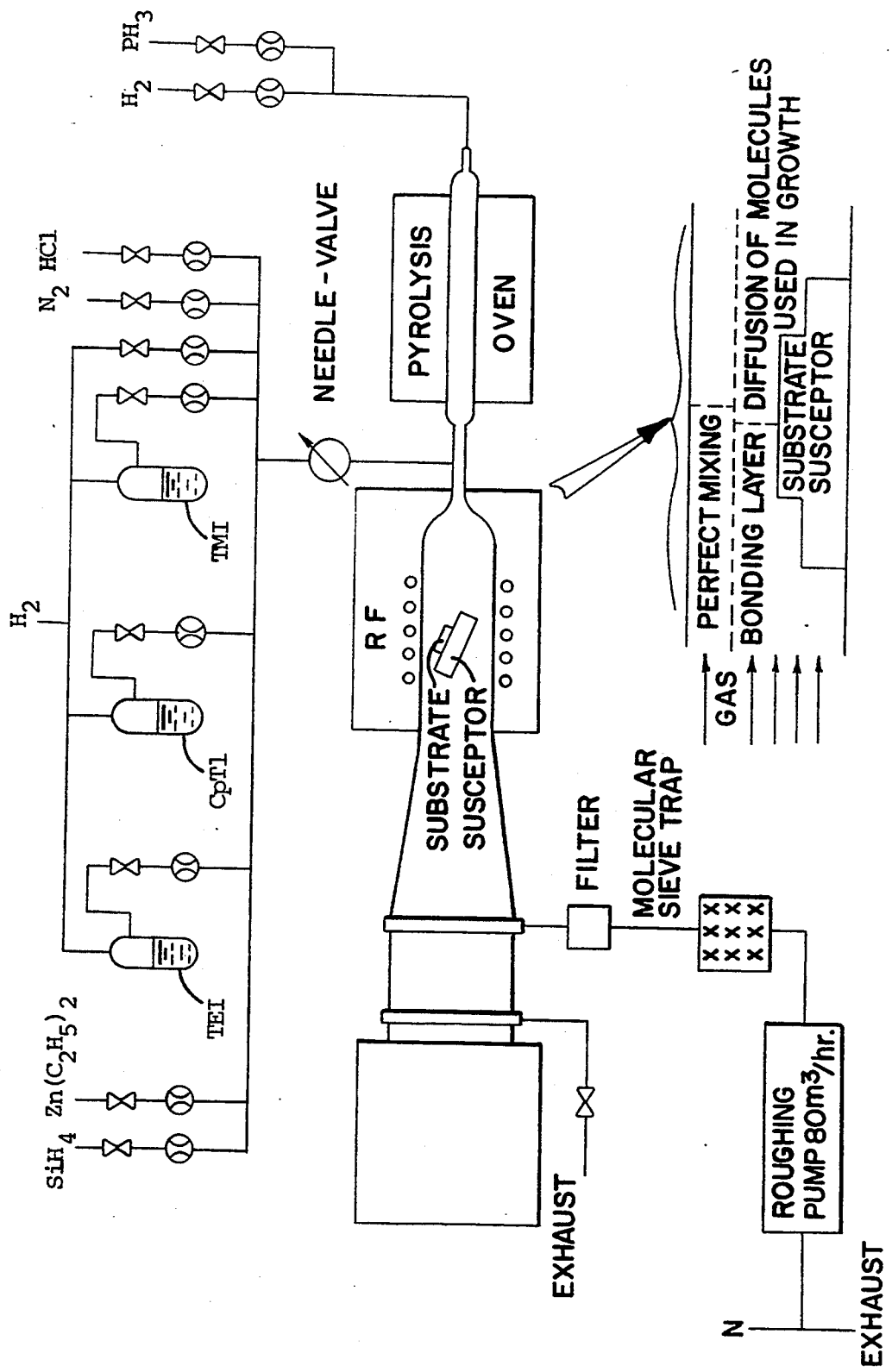

SEMICONDUCTOR FILMS

This application relates to semiconductor III-V alloy compounds, and more particularly to a method of making III-V alloy compounds for use in photonic and electronic devices such as diode lasers and photodetectors.

BACKGROUND OF THE INVENTION

The growth of semiconductor III-V compounds by chemical vapor deposition (CVD) using organometallics and hydrides as elemental sources has recently developed into a viable process with many potential commercial applications. The metallo-organic chemical vapor deposition (MOCVD) process, based on the pyrolysis of alkyls of group-III elements in an atmosphere of the hydrides of group-V elements, is a common growth technique because it is well adapted to the growth of submicron layers and heterostructures.

Open-tube flow systems are used at atmospheric or reduced pressures in producing the III-V alloys. The process requires only one high-temperature zone for the in situ formation and growth of the semiconductor compound directly on a heated substrate.

Low pressure (LP-) MOCVD growth method offers an improved thickness uniformity and compositional homogeneity, reduction of autodoping, reduction of parasitic decomposition in the gas phase, and allows the growth of high-quality material over a large surface area. Growth by MOCVD takes place far from a thermodynamic equilibrium, and growth rates are determined generally by the arrival rate of material at the growing surface rather than by temperature-dependent reactions between the gas and solid phases.

There have been many III-V materials investigated for long wavelength (8-12 $\mu$m) infrared detector applications. So far, InAsSb is the III-V semiconductor alloy with the smallest energy bandgap, but its bandgap is not large enough to cover the entire 8-12 $\mu$m range. Even though further reduction in the bandgap has been achieved using strained-layer InAsSb/InSb superlattices, no lattice-matched substrate is available for these materials, so that there remains the problem of obtaining device-quality materials. InTlSb has successfully grown by low-pressure metalorganic chemical vapor deposition (LP-MOCVD) and a reduction in the bandgap energy of 100 MeV was confirmed through optical characterizations. The lattice of InTlSb was found to contact with increased thallium content and the resulting mismatch with InSb was found to be larger than the predicted estimate. Moreover, a solubility limit of thallium in InSb has been calculated to be ~15%, beyond which a two-phase region consisting of zinc-blend and CsCl-type structures is predicted. As a result, it is concluded that InTlSb/InSb is inoperative for use in semiconductor applications.

SUMMARY OF THE INVENTION

An object, therefore, of the invention is the growth of high quality III-V materials with a bandgap in the 2-12 $\mu$m range.

A further object of the subject invention is a InTlP grown by low-pressure metalorganic chemical vapor deposition (LP-MOCVD).

A still further object of the subject invention an alloy of the composition $(InP)_{1-x}(TlP_3)_x$ for use as an infrared material for use in lasers and photodetectors, where x is between 0.1 and 0.9.

These and other objects are attained by the subject invention comprising $(InP)_{1-x}(TlP_3)_x$ which is prepared by growing an InP epilayer on a semi-insulating p(Fe) doped or n+ (Sn) doped InP substrate through LP-MOCVD. In the method of the subject invention, trimethylindium and phosphine were used as the sources of In and P. The growth temperature and pressure was maintained at 510° C. and 76 torr, respectively. Growth of $(InP)_{1-x}(TlP_3)_x$ ($0.1 \leq x \leq 0.9$) was performed on the InP substrate by introducing a small flow of cyclopentadienylthallium (CpTl) without perturbing other growth conditions. The $(InP)_{x-1}(TlP)_x$ layer may be doped to vary the properties of the epilayer.

The FIGURE is a schematic diagram of the LP-MOCVD reactor for use in the method of the subject invention.

DETAILED DESCRIPTION OF THE INVENTION

The reactor and associated gas-distribution scheme used herein shown in FIGURE. The system consists of a cooled quartz reaction tube (diameter 5 cm in the substrate area) pumped by a high-capacity roughing pump (120 hr$^{-1}$) to a vacuum between 10 and 300 Torr. The substrate was mounted on a pyrolytically coated graphite susceptor that was heated by rf induction at 1 MHz. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes and Swagelock fittings. Flow rates were controlled by mass flowmeters.

The reactor was purged with a nitrogen flow of 4 liters min$^{-1}$, and the working pressure of 75 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure. The pressure in the gas panel was regulated by the needle valve placed between the gas panel and the reactor. The needle valve was adjusted to maintain a constant pressure of 1 atm on the gas panel, thereby ensuring reproducibility of flow-rate measurements.

The gas source used in this study for the growth of InP and $(InP)_{1-x}(TlP_3)_x$ by LP-MOCVD are listed in the accompanying tabulation. The organometallic

| Group-III Sources | Group-V Sources |
| --- | --- |
| In (C$_2$H$_5$)$_3$ | Et$_3$P |
| In (CH$_3$)$_3$ | Me$_3$P |
| CpTl | t-BuP |
|  | PH$_3$ | group-III species i.e., trimethyl, indium (TMI), triethyl indium (TEI), and cyclopentadienyl thallium (CpTl), are contained in stainless steel bubblers, which are held in controlled temperature baths at 31° and 0° C., respectively. An accurately metered flow of purified H$_2$ for TMI and CpTl is passed through the appropriate bubbler. To ensure that the source material remains in vapor form, the saturated vapor that emerges from the bottle is immediately diluted by a flow of hydrogen. Nitrogen may also be used as a carrier gas. The mole fraction, and thus the partial pressure, of the source species is lower in the mixture and is prevented from condensing in the stainless steel pipe work.

Pure ethyl phosphorous ($Et_3P$), methyl phosphorous ($Me_3P$), t-butyl phosphorous (t-BuP) or phosphine ($PH_3$) are used as sources of P. The metal alkyl or hydride flow can be either injected into the reactor or into the waste line by using three-way valves. In each case, the source flow is first switched into the waste line to establish the flow rate and then switched into the reactor. The total gas flow rate is 8 liters $min^{-1}$. Stable flows are achieved by the use of mass flow controllers.

Semi-insulating or n+ substrates are supplied by MCP, Crystacomm, Metals Research, or Sumitomo in the form of ingots or polished wafers. Wafers are sliced 2° off (100) toward (110) and chemically etched for 10 seconds at room temperature in a 15% bromine-methanol solution in order to remove 20 $\mu$m from each side. The wafers were then mechanochemically polished in a solution of 1.5% bromine in methanol, removing a further 80–100 $\mu$m. The substrates were finally cleaned in methanol and rinsed in isopropyl alcohol. The substrates were etched again, just before use, by dipping in 1% bromine in methanol at room temperature for one minute, rinsing in warm isopropyl alcohol, and drying. An n+ tin-doped substrate and a semi-insulating iron-doped substrate were generally used for each experiment.

The epitaxial layer quality is sensitive to the pretreatment of the substrate and the alloy composition.

Pretreatment of the substrates prior to epitaxial growth was thus found to be beneficial. One such pretreatment procedure is as follows:

1. Dipping in $H_2SO_4$ for 3 minutes with ultrasonic agitation;
2. Rinsing in Deionized $H_2O$;
3. Rinsing in hot methanol;
4. Dipping in 3% Br in methanol at room temperature for 3 minutes (ultrasonic bath);
5. Rinsing in hot methanol;
6. Dipping in $H_2SO_4$ for 3 minutes;
7. Rinsing in deionized $H_2O$, and
8. Rinsing in hot methanol.

After this treatment, it is possible to preserve the substrate for one or two weeks without repeating this treatment prior to growth.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species but is independent of temperature between 470° and 540° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

High quality $(InP)_{1-x}(TlP_3)_x$ may be grown in the method of the subject invention by low pressure metalorganic chemical vapor deposition (LP-MOCVD).

Other forms of deposition of III-V films may be used as well, including MBE. (Molecular Beam Epitoxy), MOMBE (metalorganic molecular bean epitay), LPE (liquid phase epitaxy) and VPE (vapor phase epitaxy).

In the MOCVD method the layers of the heterostructure are grown by the induction-heated horizontal cool wall reactor of FIG. 1, as described below in more detail. Trimethylindium (TMI) and cyclopentadienyl thallium (CpTl) are used as the sources of indium and thallium respectively. Pure phosphine ($PH_3$) supplied by Matheson Inc. is used as the P source. Sample is grown on a Fe doped InP substrate. The optimum growth conditions are listed in the Table, Doping of the substrate is conducted with elemental Fe for p-type doping and $SiH_4$ for n-type doping. Doping of the epilayer can be conducted with n-type dopants such as $H_2S$ OR $SiH_4$, or with p-type dopants such as diethylzinc. Doping is performed through the bubbler shown in FIG. 1 with $H_2$ as carrier gas and at temperatures from −15° C. to ambient temperatures at 20–90 $cm^3$ $min.^{-1}$ and onto either a hot or cooled substrate (535° C.). $SiH_4$ may be simply directed at ambient temperatures onto the hot substrate at 20–90 $cm^3$ $min.^{-1}$.

In a preferred doping method for incorporating the maximum amount of dopant on a layer, once the layer to be doped is fully grown, the heat source is terminated and the substrate allowed to cool; the metal and hydride sources are terminated; the dopant flow, for instance, is initiated at the temperatures indicated for diffusion onto the cooled substrate/epilayer which has been previously grown. After about 2-3 minutes, the dopant flow is terminated and the next epilayer grown.

TABLE 1

| Optimum growth conditions of $(InP)_{1-x}(TlP_3)_x$ structure on a InP substrate. | |
|---|---|
| Growth Pressure (Torr) | 76 |
| Growth Temperature (°C.) | 510 |
| Total $H_2$ Flow (liter/min) | 3 |
| TMI (cc/min) | 120 |
| $PH_3$ (cc/min) | 30 |
| CpTl | 10 |
| Growth Rate (Å/min) | 150 |

The InP layer can be grown at approximately 70-80 Torr and preferably 76 Torr and low temperature, between 470° and 540° C., preferably 510° C., by using TMI and $PH_3$ in $H_2$ or $N_2$, or $H_2$ and $N_2$ carrier gas.

Thallium can be introduced at 76 Torr and low temperature, between 470° and 540° C. and preferably 510° C., using CpTl in a $H_2$ or $N_2$ or $H_2$ and $N_2$ carrier gas. Uniform composition $(InP)_{x-1}(TlP_3)_x$ over an area of 10 $cm^2$ of InP substrate has been obtained. The growth rate is small (5 Å $sec^{-1}$), and it takes less than 1 second for the gas flow to reach its new steady state. Epilayers of 10 Å to 5 $\mu$m thick can be grown by the method of the subject invention, dependent on whether a photodetector use or a laser use is required.

The thickness of an epilayer was measured by a bevel stain technique (solution),and the composition calculated either from the PL wavelength or from the value of the lattice parameter as measured by single-crystal x-ray diffraction. The epilayer of $(InP)_{x-1}(TlP_3)_x$ are grown as follows.

EXAMPLE 1

A semiconductor alloy for an infrared detector was prepared on an InP substrate according to the above methods and in the following manner. First, a 400-$\mu$m thick InP substrate doped with Fe and/or Sn is prepared and cleaned. A 01.5 $\mu$m epilayer of InP, is grown on the Fe and Sn doped InP substrates. The growth temperature was 510° C. for 90 minutes. A flow of CpTl was introduced at 510° C. for 30 minutes. The resulting $(InP)_{x-1}(TlP_3)_x$ epilayer was 1.05 $\mu$m thick.

The structural, electrical, and optical properties of these films were then compared using X-ray diffraction system, electrochemical C-V (ECV) profiler, Hall system, and photoluminescence (PL). X-ray diffraction measurements of both samples showed one sharp peak at an angle corresponding to InP. This is not an unexpected result for the $(InP)_{1-x}(TlP_3)_x$ film since the lattice-mismatch should be negligible for such thallium concentrations. A large difference between the two films was observed in their electrical characteristics. In comparison to the hall mobility of InP (20,000 cm²/Vs) measured at 77K, the mobility of the $(InP)_{1-x}(TlP_3)$ sample was nearly an order lower (3000 cm²/Vs). At the same time, the carrier concentration determined by both Hall measurements and ECV profiler was higher for the $(InP)_{1-x}(TlP_3)_x$ sample. ECV profile also revealed a difference in the thickness of the two epilayers which were both grown for 3 hours. From this measurement, the respective growth rates of InP and $(InP)_{1-x}(TlP_3)_x$ were calculated to be approximately 0.50 $\mu$m/hr and 0.65 $\mu$m/hr.

In optical measurements, a PL experiment performed on InP/InP at 77K displayed a lone peak around 880 nm which corresponds to the luminescence wavelength of InP. For $(InP)_{1-x}(TlP_3)_x$/InP, a peak at a wavelength around 7 $\mu$m was observed in addition to an InP peak at 880 nm. In order to confirm this observation, photoconductivity measurement was carried out on the $(InP)_{1-x}(TlP_3)_x$/InP sample at 77K. For this experiment, the clover-shaped sample patterned for the Hall measurement was used. The measurement showed a weak but a definite photoresponse with a cut-off wavelength around 6-7 $\mu$m.

From the above it is concluded that a $(InP)_{1-x}(TlP_3)_x$ film ($0.1 \leq x \leq 0.9$) has a stable zinc blende structure with a maximum lattice mismatch between the endpoints of 1.28%. Further the film of the subject invention accepts both p-doping and n-doping. A bandgap of about 7 $\mu$m is observed, thereby making it suitable for long wavelength infrared detector applications as well as lasers.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

I claim:

1. An alloy for use as a semiconductor film comprising $(InP)_{1-x}(TlP_3)_x$ where $0.1 \leq x \leq 0.9$.

2. The alloy of claim 1 wherein said alloy has a zinc blende structure.

3. The alloy of claim 1 wherein said alloy is doped with a p-type element or a n-type element.

* * * * *

UNITED STATES PATENT AND TRADEMARK OFFICE
CERTIFICATE OF CORRECTION

PATENT NO. : 5,410,178
DATED : April 25, 1995
INVENTOR(S) : M. Razeghi

It is certified that error appears in the above-indentified patent and that said Letters Patent is hereby corrected as shown below:

Column 1, line 3, insert the following :

— This invention was made with Government support under Grants N00014-93-1-0235 and N00014-92-J-1951 awarded by the Department of the Navy. The Government has certain rights in the invention.—

Signed and Sealed this

Eleventh Day of July, 1995

Attest:

BRUCE LEHMAN

Attesting Officer

Commissioner of Patents and Trademarks